US012089362B2

(12) United States Patent
Sato et al.

(10) Patent No.: US 12,089,362 B2
(45) Date of Patent: Sep. 10, 2024

(54) BLANK PANEL

(71) Applicant: Nippon Telegraph and Telephone Corporation, Tokyo (JP)

(72) Inventors: Noriyuki Sato, Musashino (JP); Mineki Ogata, Musashino (JP); Kosuke Watanabe, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 260 days.

(21) Appl. No.: 17/625,381

(22) PCT Filed: Jul. 18, 2019

(86) PCT No.: PCT/JP2019/028294
§ 371 (c)(1),
(2) Date: Jan. 7, 2022

(87) PCT Pub. No.: WO2021/009909
PCT Pub. Date: Jan. 21, 2021

(65) Prior Publication Data
US 2022/0256725 A1    Aug. 11, 2022

(51) Int. Cl.
*H05K 7/14* (2006.01)
*H05K 7/16* (2006.01)
*H05K 7/18* (2006.01)

(52) U.S. Cl.
CPC ............. *H05K 7/1487* (2013.01); *H05K 7/16* (2013.01); *H05K 7/183* (2013.01)

(58) Field of Classification Search
CPC ........ H05K 7/183; H05K 7/1487; H05K 7/16; H05K 5/02; H05K 5/0217
See application file for complete search history.

(56) References Cited

U.S. PATENT DOCUMENTS

| | | | | |
|---|---|---|---|---|
| 6,223,908 B1* | 5/2001 | Kurtsman | ................ | H04Q 1/08 |
| | | | | 211/175 |
| 8,251,321 B2* | 8/2012 | Chen | .................... | H02G 3/0456 |
| | | | | 312/273 |
| 8,562,086 B1* | 10/2013 | Baik | .................... | A47B 88/931 |
| | | | | 312/334.4 |
| 8,701,902 B2* | 4/2014 | Oura | .................... | H05K 7/1421 |
| | | | | 312/334.3 |

(Continued)

FOREIGN PATENT DOCUMENTS

WO    WO 2013027285    2/2013

OTHER PUBLICATIONS

[No Author Listed] [online], "19 inch panel," Settsu Material Industrial Co., Ltd., available on or before Jan. 22, 2011, retrieved on Jul. 1, 2019, retrieved from URL <http://www.settsu.co.jp/catalogs/smasrc/47>, 5 pages (with English Translation).

(Continued)

*Primary Examiner* — Daniel J Rohrhoff
(74) *Attorney, Agent, or Firm* — Fish & Richardson P.C.

(57) ABSTRACT

A blank panel of the present disclosure includes a partial panel and a partial panel, in which the partial panel includes an attachment portion attached to a rack and a link portion linked to the partial panel, and the partial panel includes an attachment portion attached to the rack and a link portion linked to the partial panel.

8 Claims, 11 Drawing Sheets

(56) References Cited

U.S. PATENT DOCUMENTS

| | | | | |
|---|---|---|---|---|
| 11,659,679 B1* | 5/2023 | Marcade | ................ | H05K 7/183 |
| | | | | 312/334.1 |
| 2001/0040142 A1* | 11/2001 | Haney | ................ | H05K 7/1489 |
| | | | | 211/183 |
| 2003/0136749 A1* | 7/2003 | Williams | ............... | A47B 88/43 |
| | | | | 211/175 |
| 2006/0157436 A1* | 7/2006 | Iwamoto | ................ | A47B 57/30 |
| | | | | 211/26 |
| 2011/0186532 A1* | 8/2011 | Wu | ........................ | A47B 96/00 |
| | | | | 312/324 |
| 2014/0144858 A1* | 5/2014 | Yokosawa | .............. | H05K 7/183 |
| | | | | 211/182 |
| 2021/0337695 A1* | 10/2021 | Chen | .................... | H05K 7/1489 |

OTHER PUBLICATIONS

[No Author Listed] [online], "About 19 inch standard," Settsu Material Industrial Co., Ltd., available on or before Mar. 30, 2009, retrieved on Jul. 1, 2019, retrieved from URL <https://www.settsu.co.jp/technique/nineteeninch/>, 5 pages (with English Translation).

* cited by examiner

BLANK PANEL

CROSS-REFERENCE TO RELATED APPLICATIONS

This application is a National Stage application under 35 U.S.C. § 371 of International Application No. PCT/JP2019/028294, having an International Filing Date of Jul. 18, 2019. The disclosure of the prior application is considered part of the disclosure of this application, and is incorporated in its entirety into this application.

TECHNICAL FIELD

The present disclosure relates to a blank panel.

BACKGROUND ART

A blank panel may be attached to a rack accommodating a device such as a server. The blank panel is a member that blocks a portion on which no device is mounted in the whole rack. The blank panel can have holes for ventilation and ensure airflow in the rack, can have instruments for holding a member such as a cable connected to a device and hold the member, or can have a connection port for a member such as a connector and function as a connection point for the member. Specific examples of the blank panel are disclosed in, for example, Non Patent Literatures 1 and 2.

CITATION LIST

Non Patent Literature

Non Patent Literature 1: Settsu Metal Industrial Co., Ltd., "About 19-inch standard", [online]. [Retrieved Jul. 1, 2019]. Internet <URL: https://www.settsu.co.jp/technique/nineteeninch/>
Non Patent Literature 2: Settsu Metal Industrial Co., Ltd., "19-inch panel", [online], [Retrieved Jul. 1, 2019], Internet <URL: http://www.settsu.co.jp/catalogs/smasrc/47>

SUMMARY OF THE INVENTION

Technical Problem

It may be desired to remove or attach a blank panel during service operation. However, for example, a cable connected to a device may hinder the removal or attachment of the blank panel. For this reason, in known techniques, it is necessary to relocate the cable for removal and attachment of the blank panel. However, there is a problem that the cable relocation work requires large amounts of labor and time, or the service is forced to interrupt during the relocation work from the viewpoint of avoiding contact with the cable during service operation.

In view of such circumstances, it is an object of the present disclosure to facilitate removal and attachment of a blank panel from and to a rack.

Means for Solving the Problem

In order to solve the above-mentioned problems, a blank panel of the present disclosure includes a first partial panel and a second partial panel, the first partial panel includes a first attachment portion attached to a rack and a first link portion linked to the second partial panel, and the second partial panel includes a second attachment portion attached to the rack and a second link portion linked to the first partial panel.

Effects of the Invention

According to the present disclosure, it is possible to facilitate removal and attachment of a blank panel from and to a rack.

DESCRIPTION OF EMBODIMENTS

Hereinafter, an embodiment for carrying out the present disclosure (hereinafter, referred to as "the present embodiment") will be described with reference to the drawings.

First Embodiment

Configuration

Figure 1:
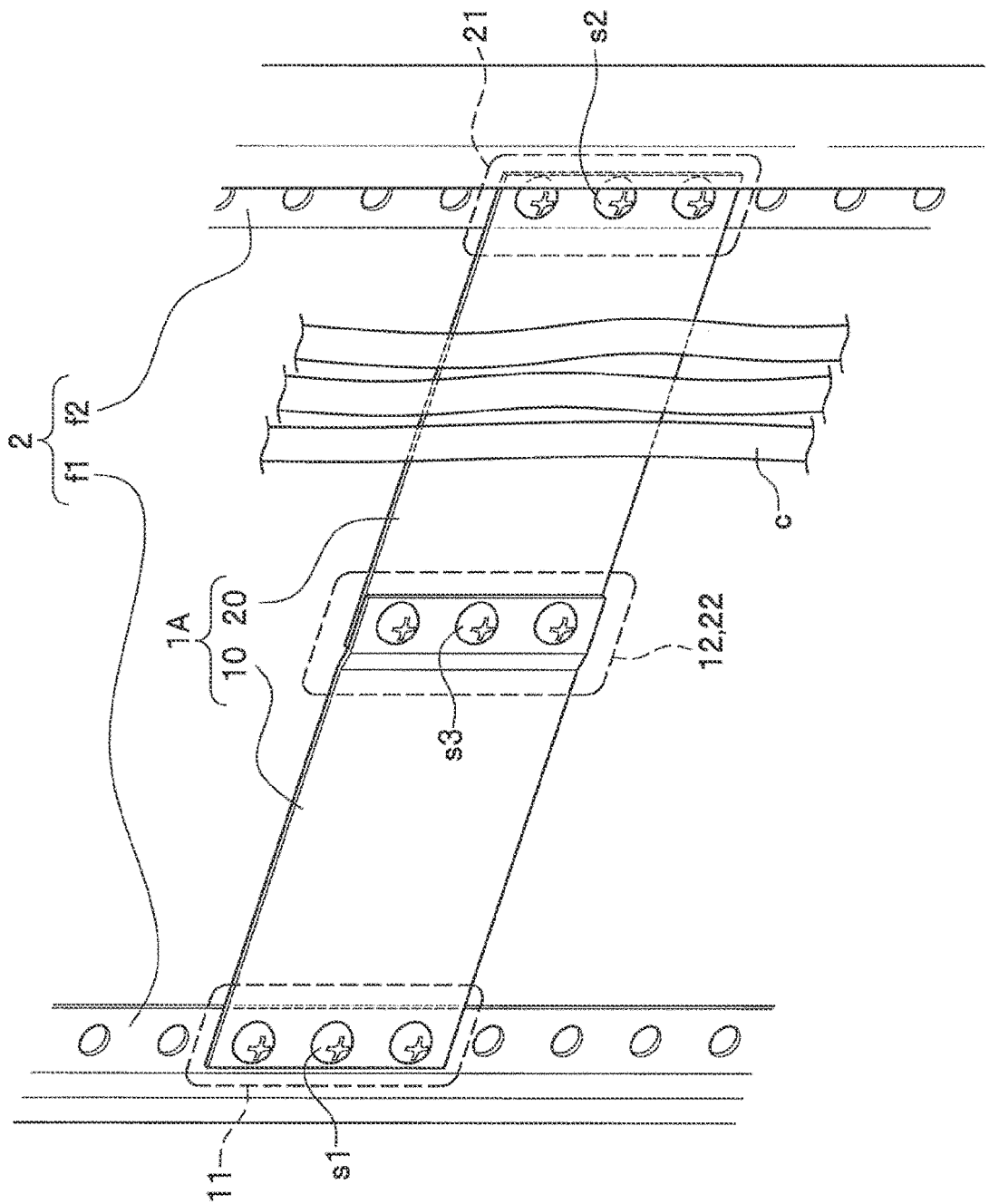
FIG. 1 is a perspective view of a blank panel according to a first embodiment.

As illustrated in FIG. 1, a blank panel 1A of a first embodiment is a rectangular body a lateral direction of which is a longitudinal direction. The blank panel 1A is provided across frames f1 and f2 of a rack 2. The blank panel 1A includes partial panels 10 and 20 (a first partial panel and a second partial panel). The frames f1 and f2 extend vertically.

The partial panel 10 constitutes a left half of the blank panel 1A. The partial panel 10 includes an attachment portion 11 (a first attachment portion) and a link portion 12 (a first link portion). The attachment portion 11 is attached to the frame f1. The attachment portion 11 is a lateral end portion of the partial panel 10. The link portion 12 is linked to the partial panel 20. The link portion 12 is an end portion of the partial panel 10 on a side opposite to the attachment portion 11 in the lateral direction.

The partial panel 20 constitutes a right half of the blank panel 1A. The partial panel 20 includes an attachment portion 21 (a second attachment portion) and a link portion 22 (a second link portion). The attachment portion 21 is attached to the frame f2. The attachment portion 21 is a lateral end portion of the partial panel 20. The link portion 22 is linked to the partial panel 10. The link portion 22 is an end portion of the partial panel 20 on a side opposite to the attachment portion 21 in the lateral direction.

A device (not illustrated) such as a server is mounted on the rack 2, and there are a large number of cables c connected to the device. As illustrated in FIG. 1, the cables c are adjusted to be gathered in a removal direction of the blank panel 1A (hereinafter it may be simply referred to as a "removal direction") with respect to the partial panel 20. As a result, the cables c are not present in the removal direction of the partial panel 10.

Figure 2:
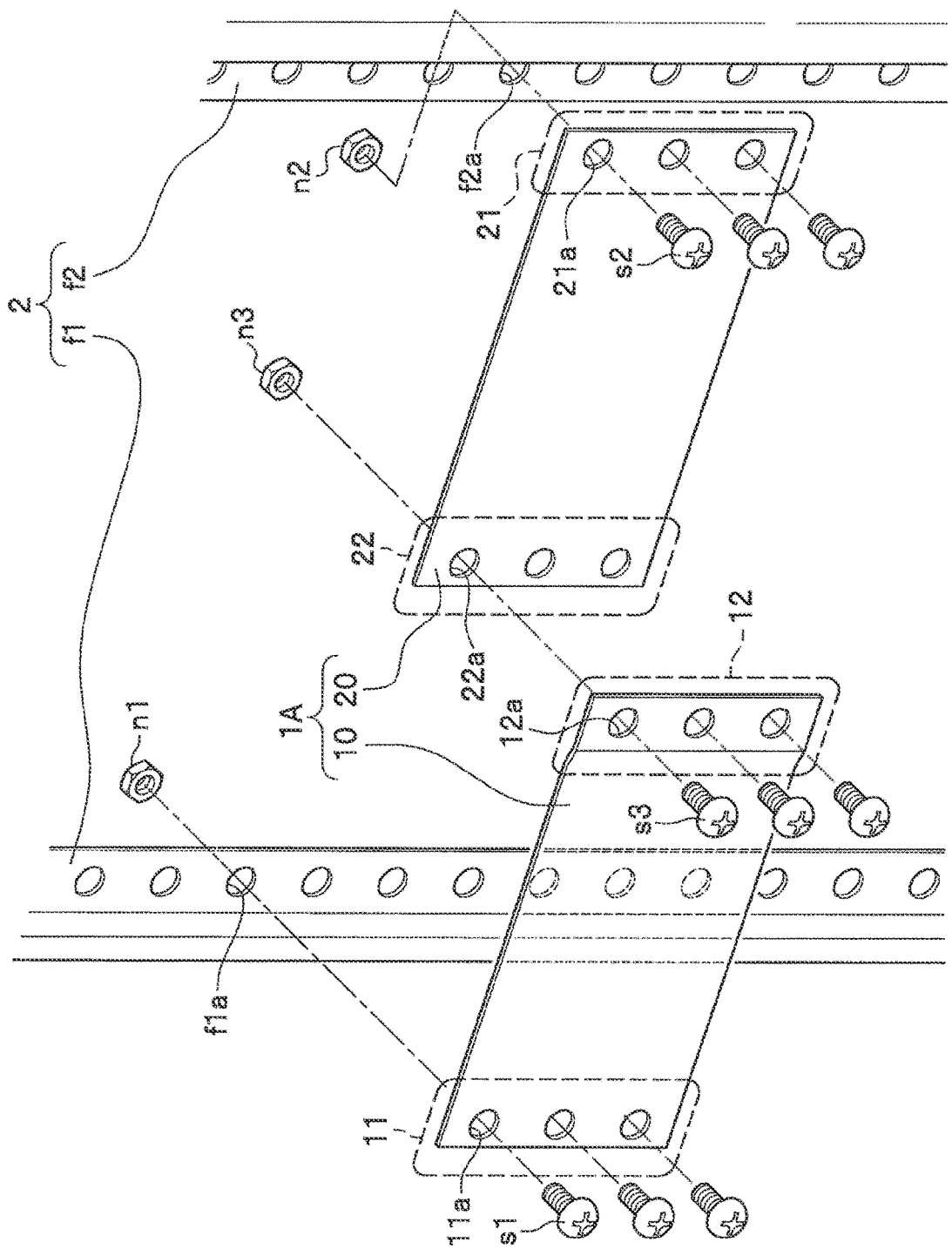
FIG. 2 is an exploded view of the blank panel according to the first embodiment.

As illustrated in the exploded view of FIG. 2 (the cables c are not illustrated), the attachment portion 11 of the partial panel 10 includes holes 11a. The holes 11a can communicate with holes f1a of the frame f1. Using screws s1 and nuts n1, the attachment portion 11 can be attached to the frame f1 by screwing through the holes 11a and f1a from an attachment direction (a direction opposite to the removal direction; hereinafter, it may be simply referred to as an "attachment direction") of the blank panel 1A. Further, the attachment portion 21 of the partial panel 20 includes holes 21a. The holes 21a can communicate with holes f2a of the frame f2. Using screws s2 and nuts n2, the attachment portion 21 can be attached to the frame f1 by screwing through the holes 21a and f2a from the attachment direction.

Further, the link portion 12 of the partial panel 10 includes holes 12a. The link portion 22 of the partial panel 20 includes holes 22a. The link portion 12 presents with a step in the removal direction with respect to the entire partial panel 10. When the link portion 12 overlaps the link portion 22 from the attachment direction, the holes 12a communicate with the holes 22a. Using screws s3 and nuts n3, the partial panel 10 and 20 can be linked by screwing through the holes 12a and 22a from the attachment direction.

Also, since the link portion 12 presents with the step in the removal direction with respect to the entire partial panel 10, a back surface of the partial panel 10, that is, the surface on the attachment side, is flush with a back surface of the partial panel 20. As a result, attachment states of the attachment portions 11 and 21 are the same.

Removal Procedure

Figure 3:
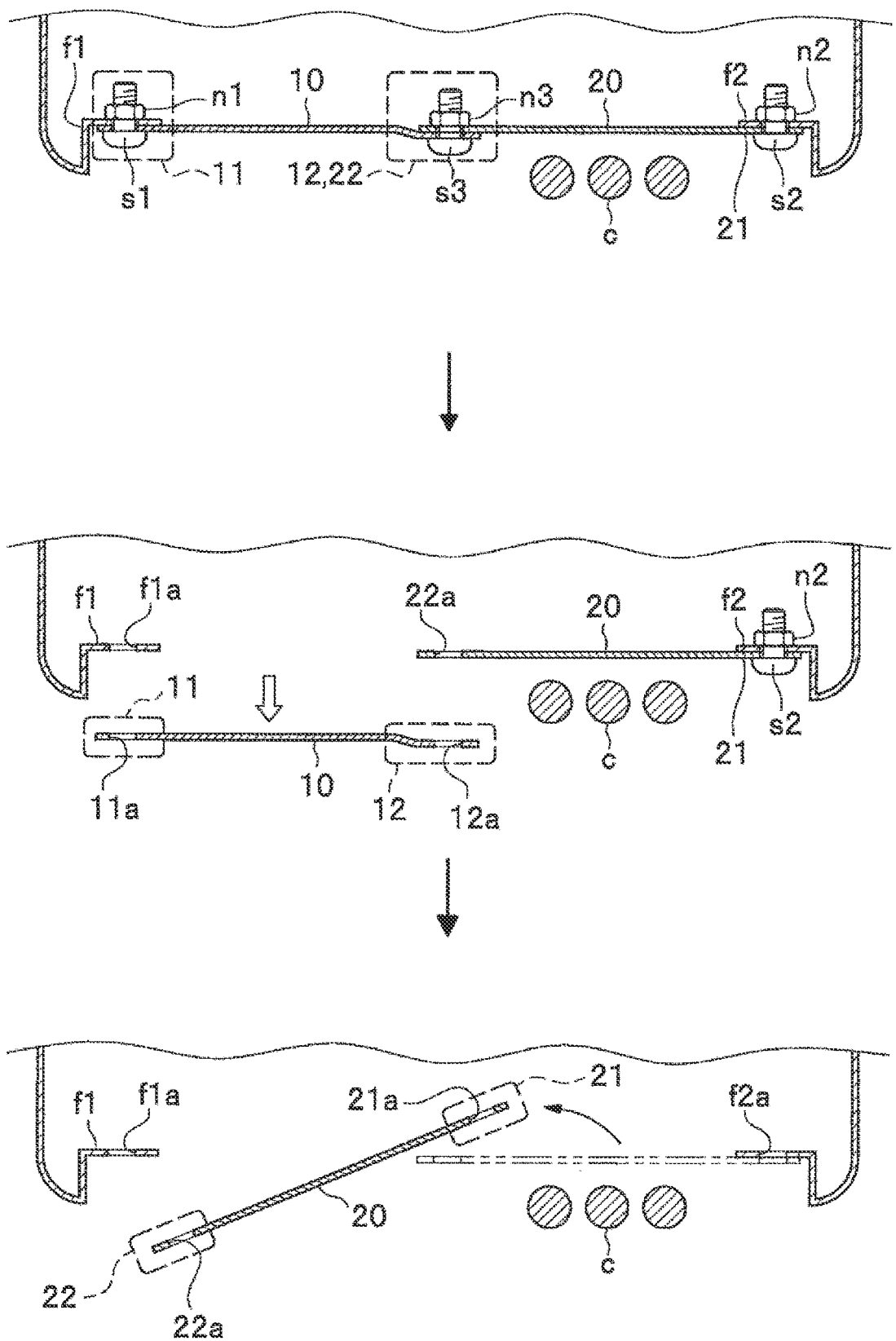
FIG. 3 is an explanatory diagram of a blank panel removal procedure according to the first embodiment.

Referring to FIG. 3, a case of removing the blank panel 1A from the rack 2 will be described. As illustrated at the upper part of FIG. 3, the cables c are gathered in the removal direction with respect to the partial panel 20.

First, as illustrated in the middle of FIG. 3, an operator removes the partial panel 10. Specifically, the operator loosens the screws s1 to release the attachment of the attachment portion 11 to the frame f1 and loosens the screws s3 to release the link between the link portions 12 and 22. Since the cables c are not present in the removal direction with respect to the partial panel 10, the operator can easily perform the removal of the partial panel 10 without coming into contact with the cables c.

Next, as illustrated at the lower part of FIG. 3, the operator removes the partial panel 20. Specifically, the operator loosens the screws s2 to release the attachment of the attachment portion 21 to the frame f2. Since the partial panel 10 has already been removed, a space is formed. Thus, by carrying the partial panel 20 so as to through the formed space, the operator can remove the partial panel 20 while avoiding the cables c. As a result, the operator can easily perform the removal of the partial panel 20 without coming into contact with the cables c.

In this way, the removal of the blank panel 1A is completed.

Attachment Procedure

Figure 4:
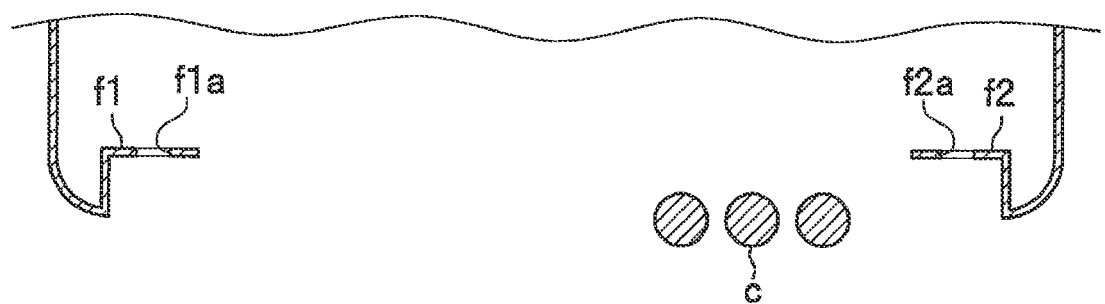
FIG. 4 is an explanatory diagram of a blank panel attachment procedure according to the first embodiment.
Figure 4:
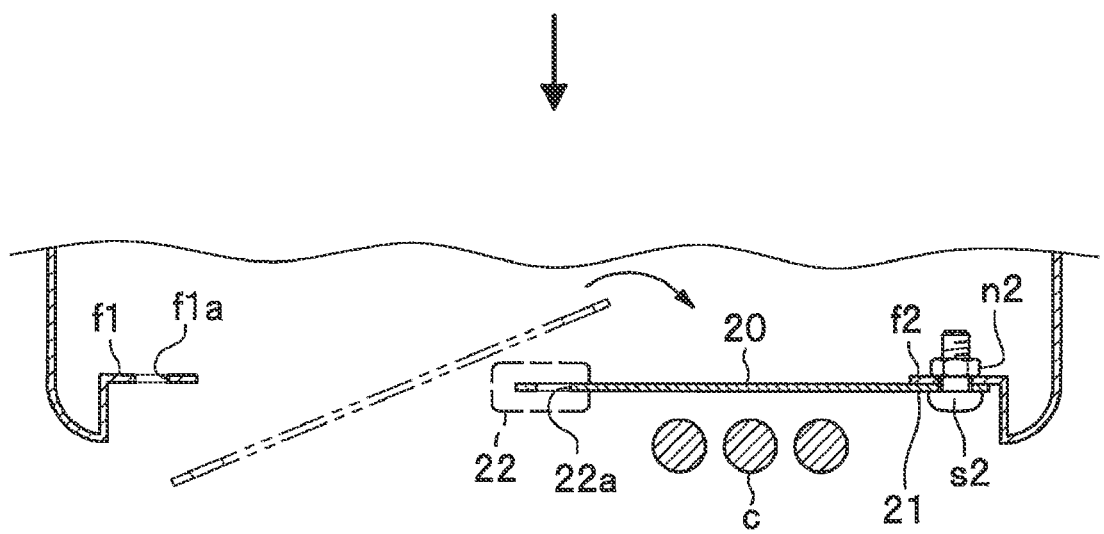
Figure 4:
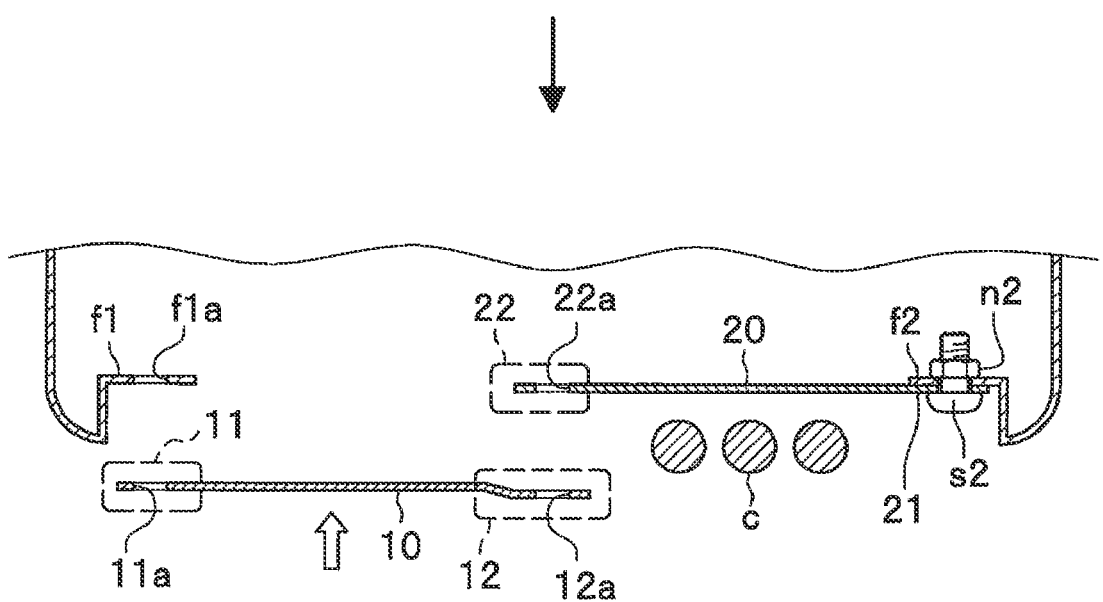

Referring to FIG. 4, a case of attaching the blank panel 1A to the rack 2 will be described. As illustrated at the upper part of FIG. 4, the cables c are gathered in the removal direction with respect to the partial panel 20, which will eventually be attached.

First, as illustrated in the middle of FIG. 4, the operator attaches the partial panel 20. Specifically, the operator carries the partial panel 20 in the attachment direction with respect to the cables c while avoiding the cables c via the space in which the partial panel 10 will be disposed later. Further, the operator aligns the holes 21a of the attachment portion 21 of the partial panel 20 with the holes f2a of the frame f2 and performs screwing with the screws s2, thereby attaches the partial panel 20 to the frame f2.

Next, as illustrated at the lower part of FIG. 4, the operator attaches the partial panel 10. Specifically, the operator aligns the holes 11a of the attachment portion 11 of the partial panel 10 with the holes f1a of the frame f1 and performs screwing with the screws s1, thereby attaches the partial panel 10 to the frame f1. In addition, the operator aligns the holes 12a of the link portion 12 with the holes 22a of the link portion 22 and performs screwing with the screws s3, thereby achieves the link between the link portions 12 and 22. Since the cables c are not present in the removal direction with respect to the partial panel 10, the operator can easily perform the attachment of the partial panel 10 without coming into contact with the cables c.

In this way, the attachment of the blank panel 1A is completed.

According to the first embodiment, the partial panels 10 and 20 can be removed or attached in order without coming into contact with the cables c. For this reason, the removal and attachment of the blank panel 1A from and to the rack 2 can be facilitated.

Second Embodiment

Configuration

Figure 5:
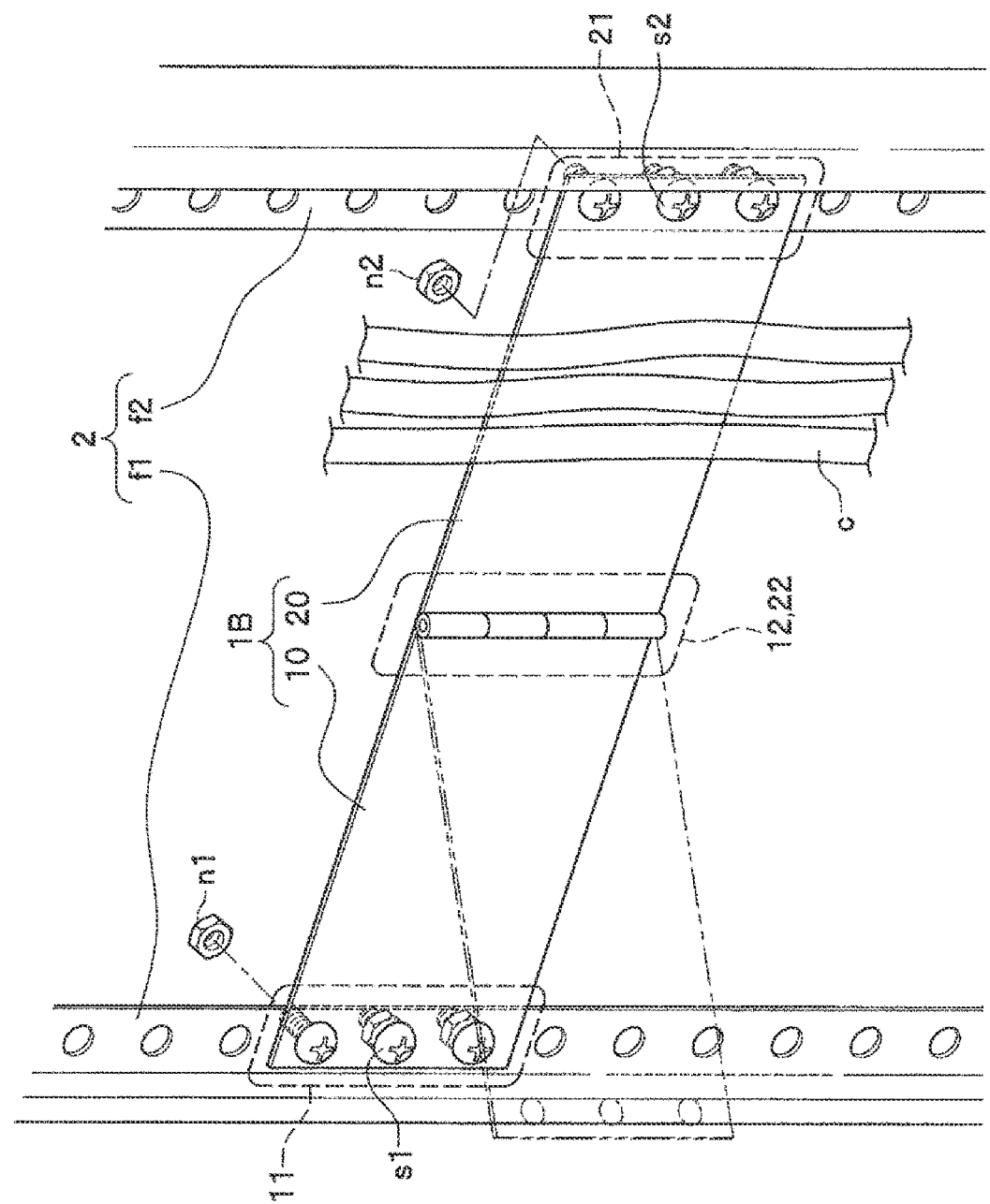
FIG. 5 is a perspective view of a blank panel according to a second embodiment.

In describing a second embodiment, repeated descriptions from the first embodiment will be omitted, and different points will be mainly described. As illustrated in FIG. 5, a blank panel 1B of the second embodiment includes the partial panels 10 and 20 that are arranged in the lateral direction. In the second embodiment, the link portion 12 of the partial panel 10 and the link portion 22 of the partial panel 20 are hinges, and the blank panel 1B is configured to be horizontally bendable.

Removal Procedure

Figure 6:
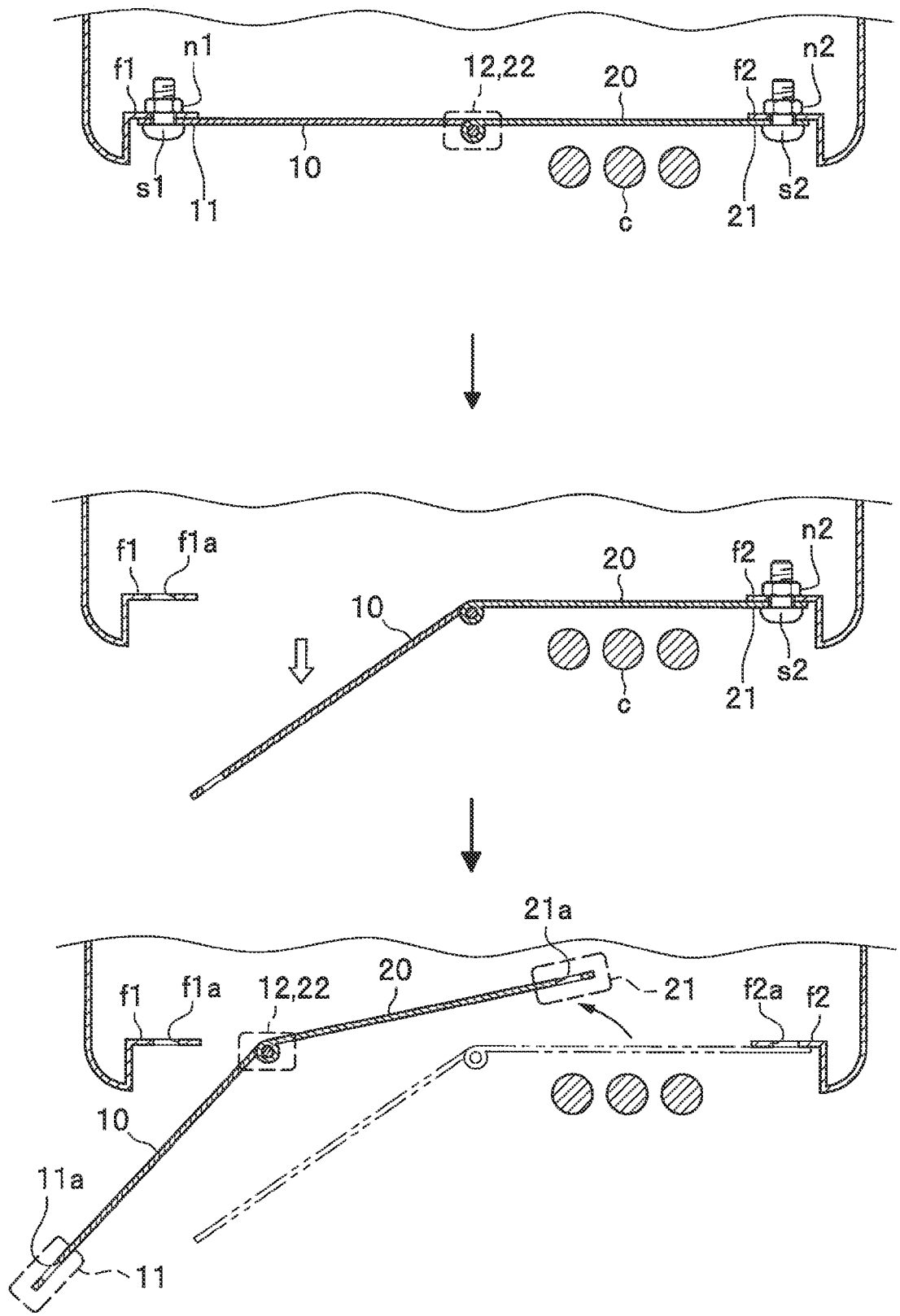
FIG. 6 is an explanatory diagram of a blank panel removal procedure according to the second embodiment.

Referring to FIG. 6, a case of removing the blank panel 1B from the rack 2 will be described. As illustrated at the upper part of FIG. 6, the cables c are gathered in the removal direction with respect to the partial panel 20.

First, as illustrated in the middle of FIG. 6, the operator removes the partial panel 10. Specifically, the operator loosens the screws s1 to release the attachment of the attachment portion 11 to the frame f1 and moves the partial panel 10 in the removal direction, with the link portions 12 and 22 as a rotation center, to bend the blank panel 1B. Since the cables c are not present in the removal direction with respect to the partial panel 10, the operator can easily perform the removal of the partial panel 10 without coming into contact with the cables c.

Next, as illustrated at the lower part of FIG. 6, the operator removes the partial panel 20. Specifically, the operator loosens the screws s2 to release the attachment of the attachment portion 21 to the frame f2. Since the blank panel 1B has already been bent, a space is formed. Thus, by carrying the partial panel 20 so as to through the formed space, the operator can remove the partial panel 20 while avoiding the cables c. As a result, the operator can easily perform the removal of the partial panel 20 without coming into contact with the cables c.

In this way, the removal of the blank panel 1B is completed.

Attachment Procedure

Figure 7:
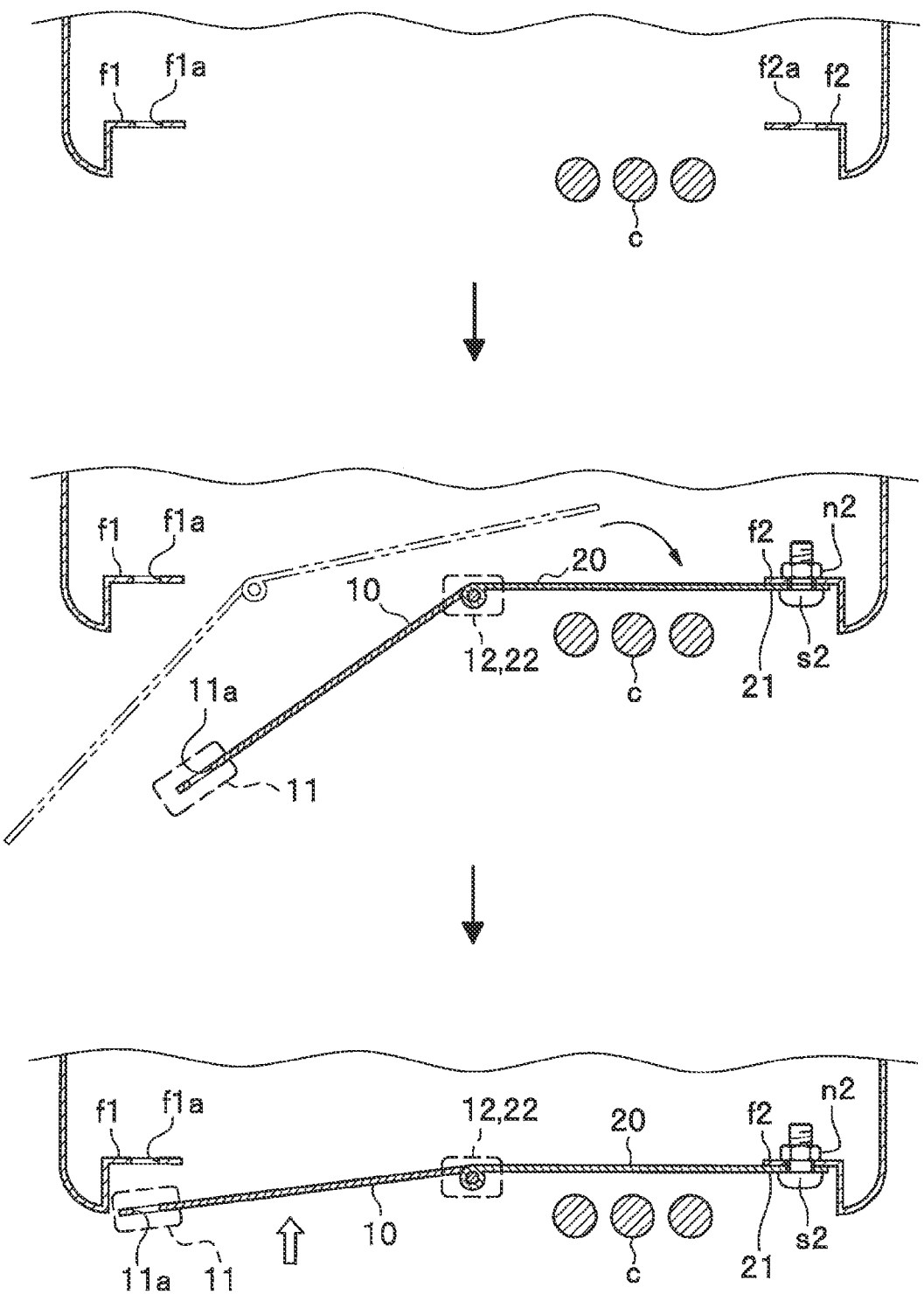
FIG. 7 is an explanatory diagram of a blank panel attachment procedure according to the second embodiment.

Referring to FIG. 7, a case of attaching the blank panel 1B to the rack 2 will be described. As illustrated at the upper part of FIG. 7, the cables c are gathered in the removal direction with respect to the partial panel 20, which will eventually be attached.

First, as illustrated in the middle of FIG. 7, the operator attaches the partial panel 20. Specifically, the operator carries the partial panel 20 (the blank panel 1B including the partial panel 20) in the attachment direction with respect to the cables c while avoiding the cables c via the space in which the partial panel 10 will be disposed later. Further, the operator aligns the holes 21a of the attachment portion 21 of the partial panel 20 with the holes f2a of the frame f2 and performs screwing with the screws s2, thereby attaches the partial panel 20 to the frame f2. As compared to the case of attaching a known single piece blank panel, the operator can hold the blank panel 1B in a bent state and attach the partial panel 20. For this reason, during the attachment operation of the partial panel 20, it is possible to prevent the blank panel 1B from coming into contact with the cables c or portions of the rack 2 other than the attaching target portions.

Next, as illustrated at the lower part of FIG. 7, the operator attaches the partial panel 10. Specifically, the operator unbends the bending of the blank panel 1B to the original state, aligns the holes 11a of the attachment portion 11 of the partial panel 10 with the holes f1a of the frame f1, and performs screwing with the screws s1, thereby attaches the partial panel 10 to the frame f1. Since the cables c are not present in the removal direction with respect to the partial panel 10, the operator can easily perform the attachment of the partial panel 10 without coming into contact with the cables c.

In this way, the attachment of the blank panel 1B is completed.

According to the second embodiment, as compared to the first embodiment, the partial panels 10 and 20 can be removed or attached without being separated.

Third Embodiment

Figure 8:
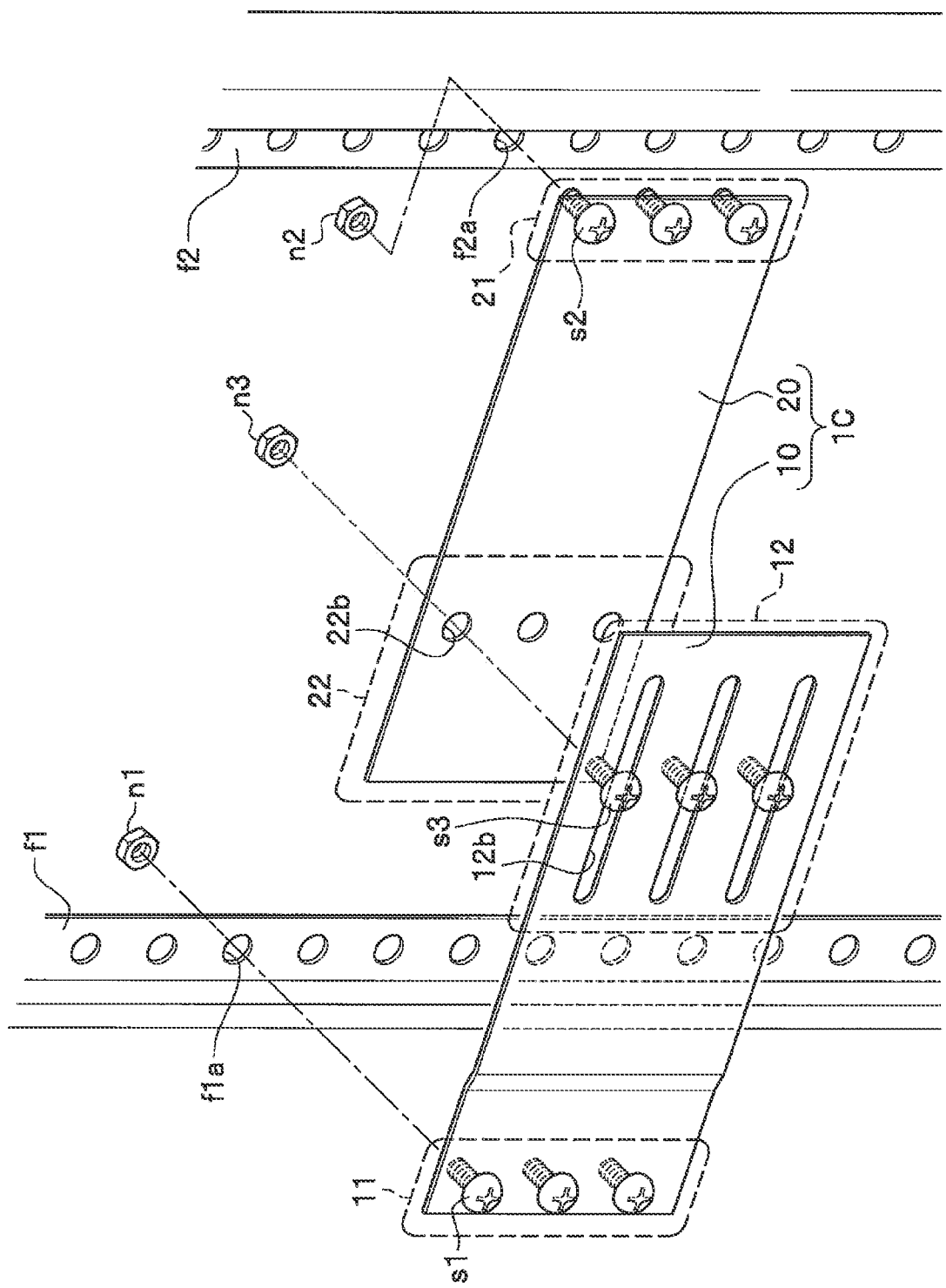
FIG. 8 is an exploded view of a blank panel according to a third embodiment.

In describing a third embodiment, repeated descriptions from the first and second embodiments will be omitted, and different points will be mainly described. As illustrated in FIG. 8, a blank panel 1C of the third embodiment includes the partial panels 10 and 20 that are arranged in the lateral direction. In a case in which a blank panel is configured of two partial panels, lateral misalignment is expected to occur between the two partial panels. In the third embodiment, the link portion 12 of the partial panel 10 and the link portion 22 of the partial panel 20 are formed to have a position adjustment function in the lateral direction.

Specifically, the link portion 12 of the partial panel 10 includes elongated holes 12b that extend in the lateral direction. Also, the link portion 22 of the partial panel 20 includes holes 22b. In a case in which the link portion 12 overlaps the link portion 22 in the attachment direction, portions of the elongated holes 12b communicate with the holes 22b. Using screws s3 and nuts n3, the partial panels 10 and 20 can be linked by screwing through the elongated holes 12b and the holes 22b from the attachment direction.

The partial panel 10 can slide with respect to the partial panel 20 as much as lateral dimensions of the elongated holes 12b allow, by the partial panel 20 and head portions of the screws s3. Thus, according to the third embodiment, a position of the partial panel 10 with respect to the partial panel 20 in the lateral direction can be appropriately determined, and the partial panels 10 and 20 can be linked even if there is lateral misalignment between the partial panels 10 and 20 by screwing at the attachment portions 11 and 21 and screwing at the link portions 12 and 22.

Because the link portion 12 presents with a step in the removal direction with respect to the entire partial panel 10, the back surface of the partial panel 10 is flush with the back surface of the partial panel 20. As a result, attachment states of the attachment portions 11 and 21 are the same.

The removal procedure and the attachment procedure of the blank panel 1C conform to the removal procedure and the attachment procedure of the blank panel 1A of the first embodiment (see FIGS. 3 and 4).

Fourth Embodiment

In describing a fourth embodiment, repeated descriptions from the first to third embodiments will be omitted, and different points will be mainly described. When a blank panel configured of two partial panels is attempted to be attached to a rack, another blank panel adjacent above or below an attachment position of the blank panel may already be attached to the rack 2. In this case, it is not possible to put hands or tools on a back side of the blank panel to be attached, that is, inside the rack 2, and attachment of the blank panel configured of two partial panels is expected to be difficult.

Figure 9:
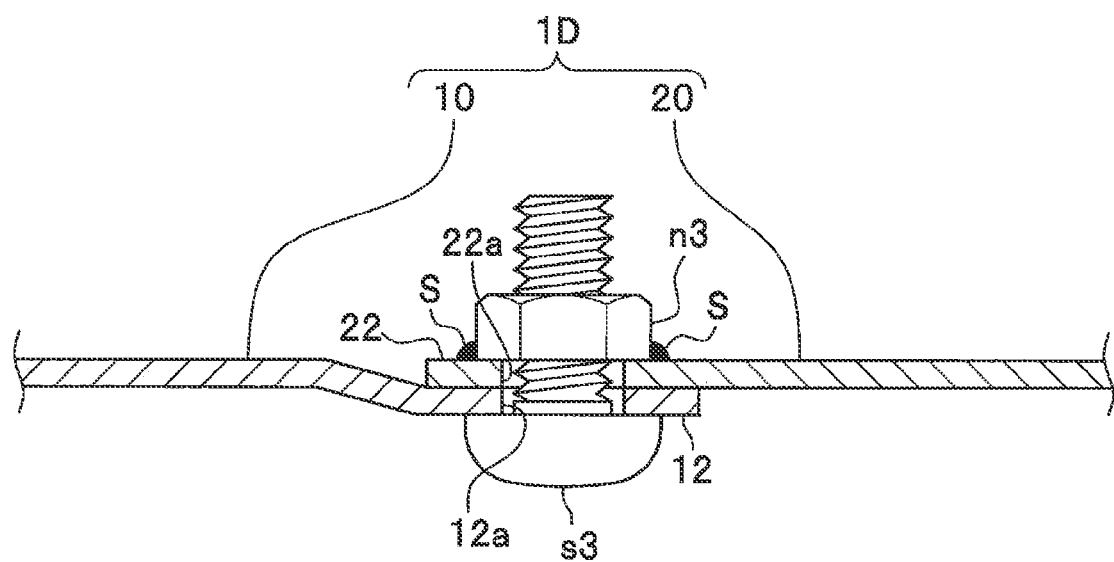
FIG. 9 is a cross-sectional view of a blank panel according to a fourth embodiment.

Thus, a configuration in which an operation for attaching a blank panel configured of two partial panels to a rack can be achieved with only an operation from the removal direction is prepared. Specifically, as illustrated in FIG. 9, a blank panel 1D of the fourth embodiment includes the partial panels 10 and 20 that are arranged in the lateral direction, and the nuts n3 are fixed to the back surface of the partial panel 20. The fixing of the nuts n3 may be performed, for example, using a method of applying solders s as illustrated in FIG. 9, or a method of applying adhesives, or by welding, but is not limited to these. Further, holes (not illustrated) of the nuts n3 communicate with the holes 22a of the link portion 22 of the partial panel 20. Also, the holes 22a communicate with the holes 12a of the link portion 12 of the partial panel 10.

When the blank panel 1D is attached to the rack 2, first, the partial panel 20 to which the nuts n3 are fixed is attached to the frame f2. Next, the partial panel 10 is attached to the frame f1. These attachment procedures conform to the attachment procedure of the blank panel 1A of the first embodiment (see FIG. 4). Next, the screws s3 are inserted from the removal direction to the attachment direction to penetrate through the holes 12a and 22a and the holes of the nuts n3 that are communicated with each other to perform screwing.

According to the fourth embodiment, the link of the partial panels 10 and 20 can be achieved with only the operation from the removal direction.

Figure 10:
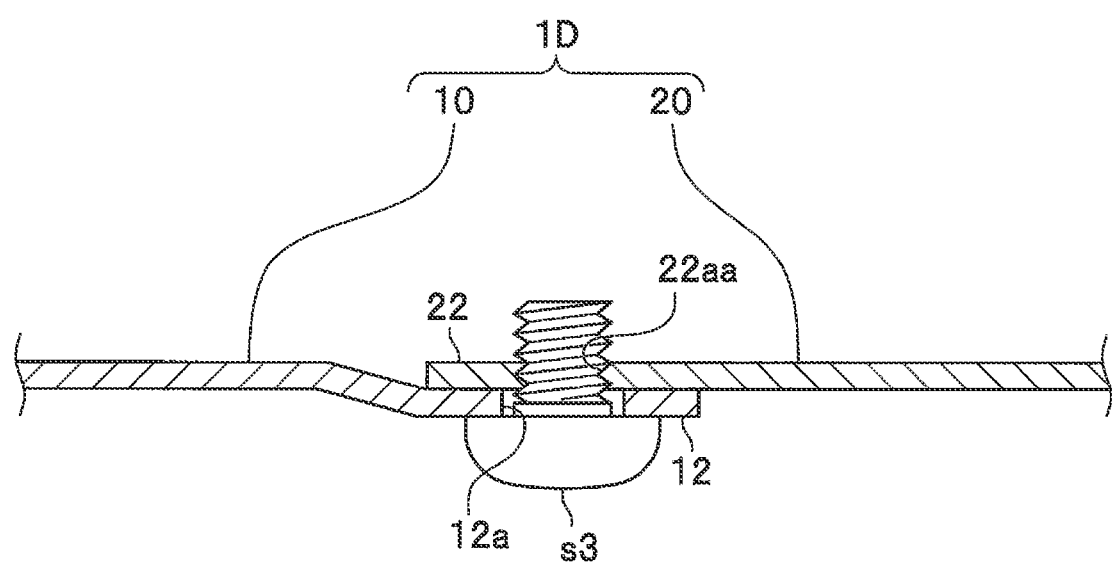
FIG. 10 is a cross-sectional view of a modified example of the blank panel according to the fourth embodiment.

Also, in the fourth embodiment, instead of fixing the nuts n3 to the back surface of the partial panel 20, internal threads may be cut with a tap (not illustrated) in holes formed in the link portion 22 of the partial panel 20 to perform screwing. As illustrated in FIG. 10, the partial panels 10 and 20 are attached to the rack 2 such that holes 22aa of the link portion 22 including internal threads are communicated with the holes 12a of the link portion 12 of the partial panel 10. Next, the screws s3 are inserted from a removal direction to the attachment direction to penetrate through the holes 12a and 22aa that are communicated with each other to perform screwing.

With the configuration illustrated in FIG. 10, the link between the link portion 12 of the partial panel 10 and the link portion 22 of the partial panel 20 can also be achieved with only the operation from the removal direction side. In addition, since the nuts n3 are not required, the number of components of the blank panel can be reduced.

Also, the screws s3 may be self-tapping screws, and in the case of an operation from the removal direction, screwing using the screws s3 may be performed while cutting the internal threads in both of the holes formed in the link portion 22 of the partial panel 20.

Fifth Embodiment

Figure 11:
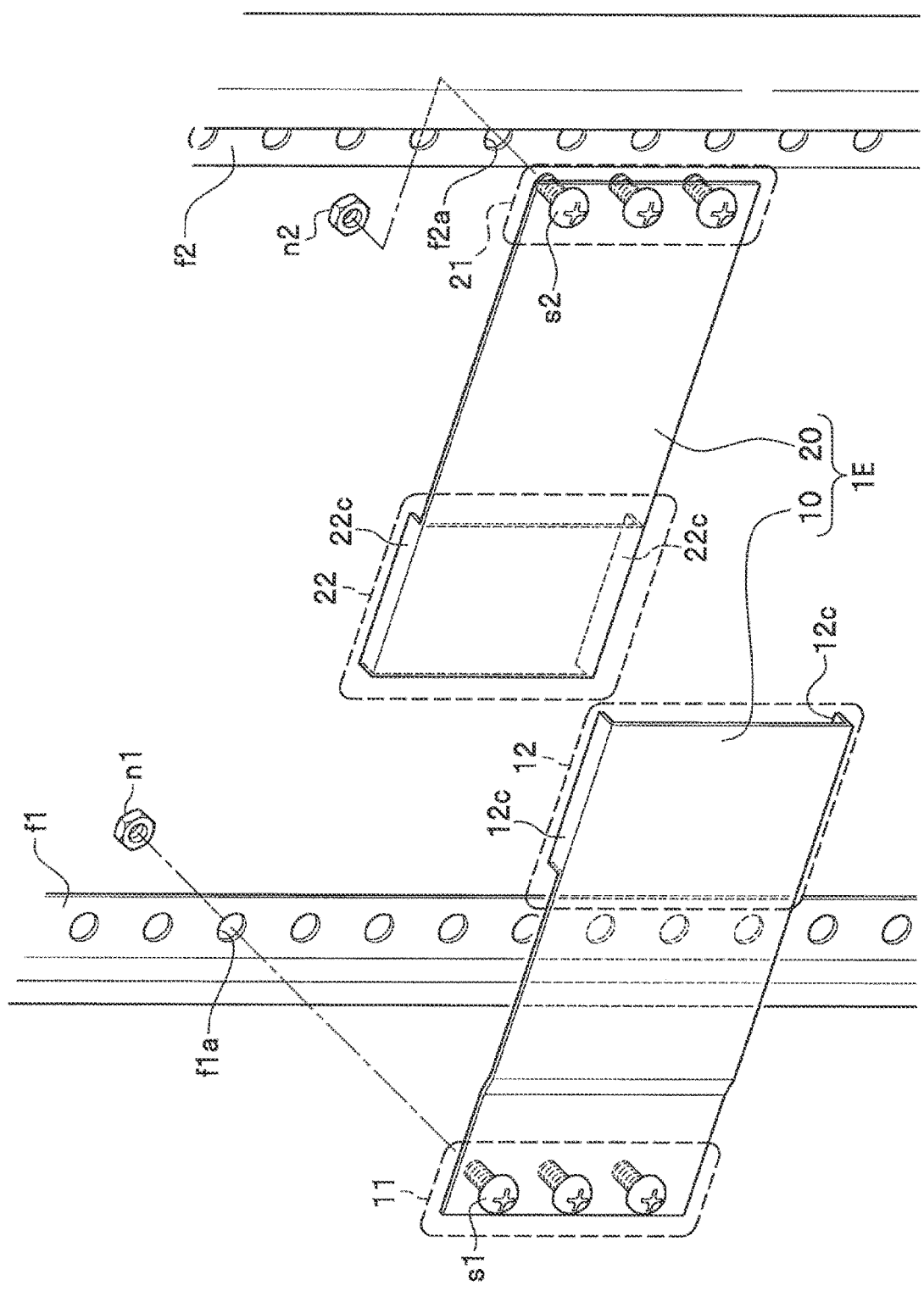
FIG. 11 is an exploded view of a blank panel according to a fifth embodiment.

In describing a fifth embodiment, repeated descriptions from the first to fourth embodiments will be omitted, and different points will be mainly described. As illustrated in FIG. 11, a blank panel 1E of the fifth embodiment includes the partial panels 10 and 20 that are arranged in the lateral direction. In a case in which a blank panel is configured of two partial panels, vertical misalignment is expected to occur between the two partial panels. In the fifth embodiment, the link portion 12 of the partial panel 10 and the link portion 22 of the partial panel 20 include a function of preventing positional misalignment in the vertical direction.

Specifically, the link portion 12 of the partial panel 10 includes a lock portion 12c (a first lock portion) provided to stand in the attachment direction with respect to the partial panel 10. Also, the link portion 22 of the partial panel 20 includes a lock portion 22c (a second lock portion) provided to stand in the attachment direction with respect to the partial panel 20. The link portions 12 and 22 of the blank panel 1E are not formed with holes like the blank panel 1A and the like, but they may also be formed with holes.

A vertical width of the link portion 12 of the partial panel 10 is slightly greater than a vertical width of the link portion 22 of the partial panel 20. For this reason, when the partial panels 10 and 20 are linked, the link portion 12 in which the lock portion 12c is provided to stand can surround the link portion 22 in which the lock portion 22c is provided to stand from the attachment direction. Also, in the fifth embodiment, the link between the partial panels 10 and 20 can be achieved by surrounding the link portion 22 with the link portion 12, and in a case in which holes are formed as in the blank panel 1A, it can be achieved by screwing.

Thus, according to the fifth embodiment, since the lock portion 12c is locked to the lock portion 22c even if the partial panel 10 attempts to be displaced in a vertical direction with respect to the partial panel 20, and the lock portion 22c is locked to the lock portion 12c even if the partial panel 20 attempts to be displaced in the vertical direction with respect to the partial panel 10, it is possible to prevent misalignment of the partial panels 10 and 20 in the vertical direction.

In addition, since the lock portion 12c functions as a folded-back portion of the partial panel 10, the bending strength of the partial panel 10 can be improved. As a result, deformation of the partial panel 10 over time can be inhibited. In addition, since the lock portion 22c functions as a folded-back portion of the partial panel 20, the bending strength of the partial panel 20 can be improved. As a result, deformation of the partial panel 20 over time can be inhibited.

Because the link portion 12 presents with a step in the removal direction with respect to the entire partial panel 10, the back surface of the partial panel 10 is flush with the back surface of the partial panel 20. As a result, attachment states of the attachment portions 11 and 21 are the same.

The removal procedure and the attachment procedure of the blank panel 1E conform to the removal procedure and attachment procedure of the blank panel 1A of the first embodiment (see FIGS. 3 and 4).

Effects

As mentioned above, each of the blank panels (1A to 1E) of the present embodiment includes a partial panel 10 and a partial panel 20. The partial panel 10 includes an attachment portion 11 attached to a rack 2 and a link portion 12 linked to the partial panel 20. The partial panel 20 includes an attachment portion 21 attached to the rack 2 and a link portion 22 linked to the partial panel 10.

Thus, each blank panel is divided into two portions, so that the partial panels 10 and 20 can be attached to the rack while avoiding cables or the like that become obstacles when a known single piece blank panel is attached or removed. For this reason, there is no need to relocate the cables.

Thus, the removal and attachment of each of the blank panels (1A to 1E) from and to the rack 2 can be facilitated.

Further, in the blank panel of the present embodiment, in a case in which the partial panel 10 and the partial panel 20 are removed in this order, the link portion 12 is linked to the link portion 22 from a removal direction.

Thus, by gathering cables c or the like in the removal direction of the partial panel 20, the partial panel 10 can be removed without worrying about the cables c or the like, and then the partial panel 20 can be removed by using a vacant space after the partial panel 10 is removed, while avoiding the cables c or the like, thereby facilitating the removal operation. Also, in the attachment operation, the partial panel 20 can be attached while avoiding the cables c or the like utilizing the space to which the partial panel 10 is to be attached, and then the partial panel 10 can be attached without worrying about the cables c or the like, thereby facilitating the attachment operation.

Further, the link portion 12 and the link portion 22 are linked by screwing.

Thus, the blank panel in which the partial panels 10 and 20 are linked can be easily configured.

Further, the nuts n3 used for screwing are fixed to the link portion 22, or the holes (for example, 22aa) including internal threads are formed are formed in the link portion 22 overlapped in an attachment direction by the link portion 12.

Thus, the partial panels 10 and 20 can be linked with only the operation from the attachment direction. As a result, even if another blank panel is already disposed adjacent to the blank panel to be attached, the blank panel can be attached without being hindered by the other blank panel.

Further, the link portion 12 includes a lock portion 12c and the link portion 22 includes a lock portion 22c, and the lock portion 12c is locked to the lock portion 22c or the lock portion 22c is locked to the lock portion 12c.

Thus, it is possible to prevent the positional misalignment between the partial panels 10 and 20.

Further, the lock portion 12c is provided to stand with respect to the partial panel 10, and the lock portion 22c is provided to stand with respect to the partial panel 20.

Thus, the bending strength of the partial panels 10 and 20 can be improved.

Further, the link portion 12 and the link portion 12 are bendably linked.

Thus, the blank panel in which the partial panels 10 and 20 are linked can be easily configured. Further, the partial panels 10 and 20 can be removed and attached without being separated.

Further, the link portion 12 and the link portion 22 include a position adjustment function for adjusting the position of the partial panel 10 with respect to the partial panel 20.

Thus, the partial panels 10 and 20 can be linked even if there is positional misalignment between the partial panels 10 and 20.

Others (a): The features described in the first to fifth embodiments can be combined as appropriate.

(b): The rack 2 used in the first to fifth embodiments has a structure that extends vertically, but the blank panel of the present disclosure can be applied to a rack that extends horizontally. In this case, the blank panel includes a partial panel that constitutes an upper half and a partial panel that constitutes a lower half. The cables or the like are gathered and held in the removal direction of one of the two partial panels.

(c): The blank panels 1A to 1E described in the first to fifth embodiments is attached to the rack 2 by screwing. However, for example, the blank panels 1A to 1E may be attached to the rack 2 with a fitting mechanism in which the partial panels 10 and 20 are provided with convex portions (or concave portions) for fitting, and the rack 2 is provided with concave portions (or convex portions) for fitting.

(d): The link between the partial panels 10 and 20 may be achieved with a fitting mechanism instead of screwing.

(e): In the present embodiment, the configuration in which the link portion 12 is linked to the link portion 22 from the removal direction has been adopted. However, this does not mean that a configuration in which the link portion 22 is linked to the link portion 12 from the removal direction cannot be adopted.

(f): In the present embodiment, the step of the link portion 12 in the link of the partial panels 10 and 20 is formed in the removal direction with respect to the entire partial panel 10. However, the step may be formed in the attachment direction. In this case, the step enters the inside of the rack 2, but the blank panel is a member that blocks an internal space of the rack 2 in which no device is disposed, and thus the entry of the step does not affect a device mounted on rack 2.

(g): The nuts n1 to n3 used for screwing may be clip nuts.

(h): In the third embodiment, by forming the elongated holes 12b in the partial panel 10 so as to extend in the lateral direction, it is possible to link the partial panels 10 and 20 even when there is positional misalignment between the partial panels 10 and 20 in the lateral direction. However, by forming elongated holes that extend vertically in the partial panel 10, it is possible to link the partial panels 10 and 20 even when there is positional misalignment between the partial panels 10 and 20 in the vertical direction.

(i): In the configuration of the third embodiment, the partial panel 10 including the elongated holes 12b is disposed in the removal direction of the partial panel 20. However, a configuration in which a partial panel including elongated holes is disposed in the attachment direction of a partial panel paired with the partial panel including elongated holes may be adopted.

(j): In the fifth embodiment, the lock portion 12c is provided to stand in the attachment direction with respect to the partial panel 10. However, this does not mean that the lock portion 12c cannot be provided to stand in the removal direction with respect to the partial panel 10. In addition, in the fifth embodiment, the lock portion 22c is provided to stand in the attachment direction with respect to the partial panel 20. However, this does not mean that the lock portion 22c cannot be provided to stand in the removal direction with respect to the partial panel 20.

(k): In the fifth embodiment, when the partial panels 10 and 20 are linked, the link portion 12 in which the lock portion 12c is provided to stand is configured to surround the link portion 22 in which the lock portion 22c is provided to stand from the attachment direction. However, the lock portion 22c may be omitted. That is, the link portion 22 may be a plate-like body without a standing portion. Even in such a configuration, by locking upper and lower end portions of the link portion 22 to the lock portion 12c, positional misalignment between the partial panels 10 and 20 in the vertical direction can be prevented. That is, the upper and lower end portions of the link portion 22 can function as the lock portion 22c.

REFERENCE SIGNS LIST 1A to 1E Blank panel
2 Rack
f1, f2 Frame
c Cable
10, 20 Partial panel (first partial panel and second partial panel)
11, 21 Attachment portion (first attachment portion and second attachment portion)
12, 22 Link portion (first link portion and second link portion)
f1a, f2a, 11a, 12a, 21a, 22a, 22b, 22aa Hole
12b Elongated hole
12c, 22c Lock portion (first lock portion and second lock portion)
s1 to s3 Screw
n1 to n3 Nut

The invention claimed is:

1. A blank panel, comprising:
a first partial panel; and
a second partial panel, wherein the first partial panel includes:
   a first attachment portion attached to a rack; and
   a first link portion linked to a second link portion of the second partial panel, wherein the first link portion is a first lateral end portion of the first partial panel and the first attachment portion is a second lateral end portion of the first partial panel on a side opposite to the first link portion, wherein the first link portion extends from the first partial panel in a different direction from a lateral direction of the first partial panel such that when the first link portion is linked to the second link portion, a back surface of the first partial panel is flush with respect to a back surface of the second partial panel; and
the second partial panel includes:
   a second attachment portion attached to the rack; and
   the second link portion linked to the first partial panel.

2. The blank panel according to claim 1,
wherein, when the first partial panel is removed and the second partial panel is subsequently removed in this order, the first link portion is linked to the second link portion from a removal direction.

3. The blank panel according to claim 2, wherein the first link portion and the second link portion are linked by screwing.

4. The blank panel according to claim 3, wherein a nut used for the screwing is fixed to the second link portion, or a hole including an internal thread is formed in the second link portion where the first link portion overlaps in an attachment direction.

5. The blank panel according to claim 2, wherein the first link portion includes a first lock portion and the second link portion includes a second lock portion, and the first lock portion is locked to the second lock portion or the second lock portion is locked to the first lock portion.

6. The blank panel according to claim 5, wherein the first lock portion is provided to stand with respect to the first partial panel, and the second lock portion is provided to stand with respect to the first partial panel.

7. The blank panel according to claim 1, wherein the first link portion and the second link portion are bendably linked.

8. The blank panel according to claim 1, wherein the first link portion and the second link portion include a position adjustment capability for adjusting a position of the first partial panel with respect to the second partial panel.

\* \* \* \* \*